United States Patent
Lin et al.

(10) Patent No.: US 9,312,259 B2
(45) Date of Patent: Apr. 12, 2016

(54) INTEGRATED CIRCUIT STRUCTURE WITH THINNED CONTACT

(71) Applicant: Taiwan Semiconductor Manufacturing Co., Ltd, Hsin-Chu (TW)

(72) Inventors: Hsin-Ying Lin, Tainan (TW); Mei-Yun Wang, Chu-Pei (TW); Hsien-Cheng Wang, Hsinchu (TW); Shih-Wen Liu, Taoyuan (TW); Fu-Kai Yang, Hsinchu (TW); Audrey Hsiao-Chiu Hsu, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 136 days.

(21) Appl. No.: 14/073,365

(22) Filed: Nov. 6, 2013

(65) Prior Publication Data

US 2015/0123213 A1    May 7, 2015

(51) Int. Cl.
*H01L 29/76* (2006.01)
*H01L 27/088* (2006.01)
*H01L 21/8234* (2006.01)

(52) U.S. Cl.
CPC ...... *H01L 27/088* (2013.01); *H01L 21/823437* (2013.01); *H01L 21/823475* (2013.01)

(58) Field of Classification Search
CPC ............. H01L 27/088; H01L 27/0886; H01L 21/823431; H01L 29/42376; H01L 21/823481
USPC .................... 257/401, 365, E23.151
See application file for complete search history.

(56) References Cited

U.S. PATENT DOCUMENTS

2006/0113533 A1* 6/2006 Tamaki et al. .................. 257/48

* cited by examiner

*Primary Examiner* — Andy Huynh
(74) *Attorney, Agent, or Firm* — Birch, Stewart, Kolasch & Birch, LLP

(57) ABSTRACT

Embodiments of mechanism for an integrated circuit (IC) structure are provided. The IC structure includes a substrate including a first diffusion region, a second diffusion region, and an isolation structure separating the first diffusion region and the second diffusion region. The IC structure further includes a gate structure formed over the substrate, and the gate structure extends from the first diffusion region to the second diffusion region. The IC structure further includes a contact formed over the substrate, and the contact includes a wide portion over the first diffusion region and the second diffusion region and a thin portion over the isolation structure.

20 Claims, 10 Drawing Sheets

United States Patent US 9,312,259 B2

INTEGRATED CIRCUIT STRUCTURE WITH THINNED CONTACT

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, although existing manufacturing process for IC devices have been generally adequate for their intended purposes, as device scaling-down continues, they have not been entirely satisfactory in all respects.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1A:
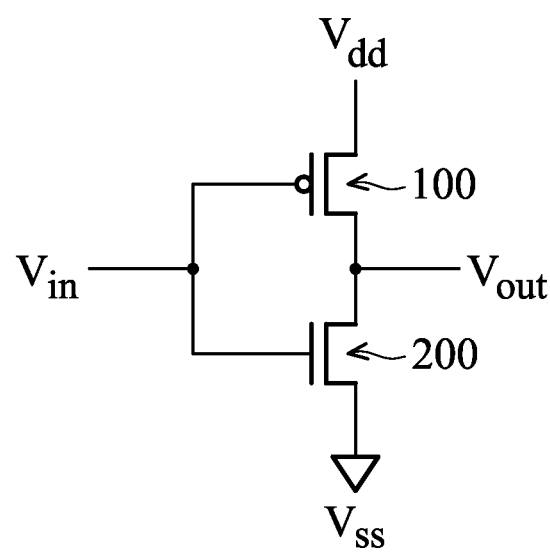
FIG. 1A illustrates a circuit diagram of a first semiconductor device electrically connected to a second semiconductor device in accordance with some embodiments.
Figure 1B:
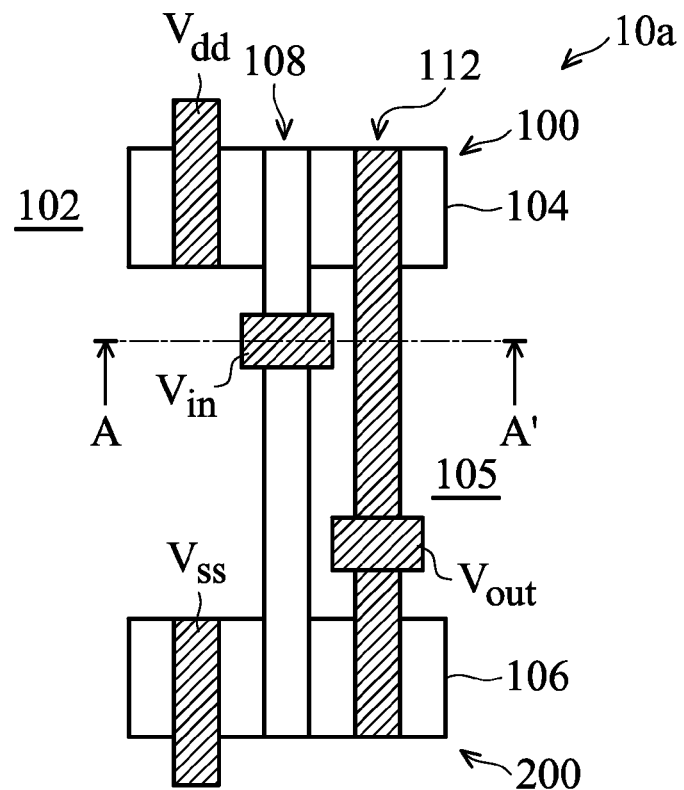
FIG. 1B illustrates a layout of an IC structure which can be represented by the circuit diagram shown in FIG. 1A in accordance with some embodiments.
Figure 1C:
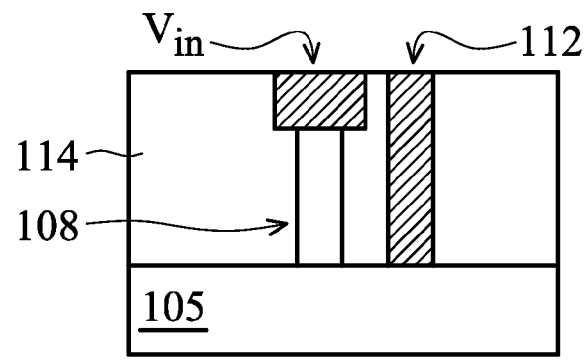
FIG. 1C illustrates a cross-sectional representation of the IC structure shown along line A-A' in FIG. 1B in accordance with some embodiments.

Mechanisms for an integrated circuit (IC) structure are provided in accordance with some embodiments of the disclosure. FIG. 1A illustrates a circuit diagram of a first semiconductor device 100 electrically connected to a second semiconductor device 200 in accordance with some embodiments. FIG. 1B illustrates a layout of an IC structure 10a which can be represented by the circuit diagram shown in FIG. 1A in accordance with some embodiments. FIG. 1C illustrates a cross-sectional representation of IC structure 10a along line A-A' in FIG. 1B in accordance with some embodiments.

As shown in FIGS. 1A to 1C, a substrate 102 includes a first diffusion region 104 and a second diffusion region 106, and first diffusion region 104 and second diffusion region 106 are separated by an isolation structure 105. A metal gate 108 extends from first diffusion region 104 to second diffusion region 106 across isolation structure 105 over substrate 102. First semiconductor device 100 and second semiconductor device 200 are interconnected by contact 112 formed in an inter-layer dielectric (ILD) layer 114.

In addition, IC structure 10a further includes various metal lines, such as a $V_{in}$ (input voltage) metal line, a $V_{out}$ (output voltage) metal line, a $V_{dd}$ (drain voltage) metal line, and a $V_{ss}$ (source voltage) metal line. For example, $V_{dd}$ metal line is formed over first diffusion region 104 over substrate 102, and $V_{ss}$ metal line is formed over second diffusion region 106 over substrate 102. In addition, Vdd metal line and Vss metal may further connect to other devices (not shown). $V_{in}$ metal line is formed on gate structure 108 over isolation structure 105. $V_{out}$ metal line is formed on contact 112 over isolation structure 105. The width of the metal lines may be greater than the width of gate structure 108.

However, as shown in FIG. 1C, the metal line formed over gate structure 108 (e.g. $V_{in}$ metal line) is too close to, or even in direct contact with, contact 112, and therefore the risks of signal shortage are high. Therefore, in some other embodiments, first semiconductor device 100 and second semiconductor device 200 are interconnected by an additional gate structure to prevent the signal shortage.

Figure 2A:
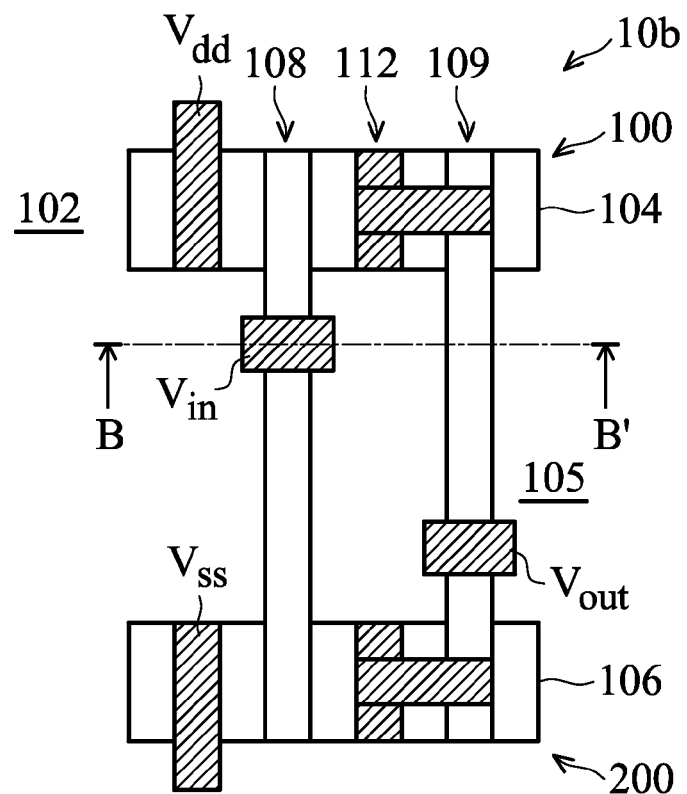
FIG. 2A illustrates a layout of an IC structure which can also be represented by the circuit diagram shown in FIG. 1A in accordance with some embodiments.
Figure 2B:
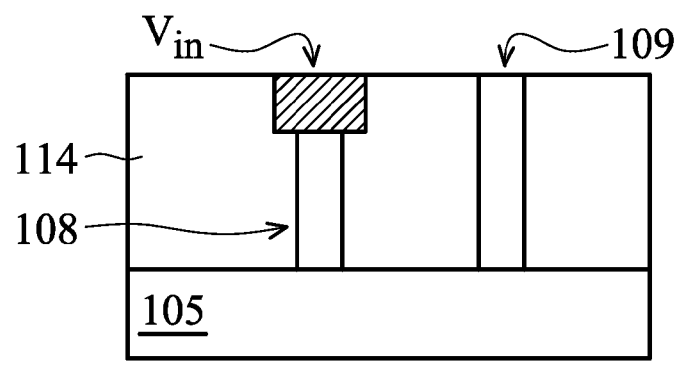
FIG. 2B illustrates a cross-sectional representation of the IC structure shown along line B-B' in FIG. 2A in accordance with some embodiments.

FIG. 2A illustrates a layout of an IC structure 10b which can also be represented by the circuit diagram shown in FIG. 1A in accordance with some embodiments. FIG. 2B illustrates a cross-sectional representation of IC structure 10b along line B-B' in FIG. 2A in accordance with some embodiments.

As shown in FIG. 2A, first semiconductor device 100 and second semiconductor device 200 are interconnected by an additional gate structure 109 instead of contact 112. Therefore, contact 112 will not be too close to $V_{in}$ metal line, and the risks of signal shortage decreases.

However, as shown in FIGS. 1B and 2A, although the circuit diagram shown in FIG. 1A can be realized by both IC structure 10a and IC structure 10b, IC structure 10b requires a larger layout area than IC structure 10a does. Therefore, an IC structure which requires a smaller layout area is required. In some embodiments, first semiconductor device 100 and second semiconductor device 200 are interconnected by a thinned contact to improve the device density.

Figure 3A:
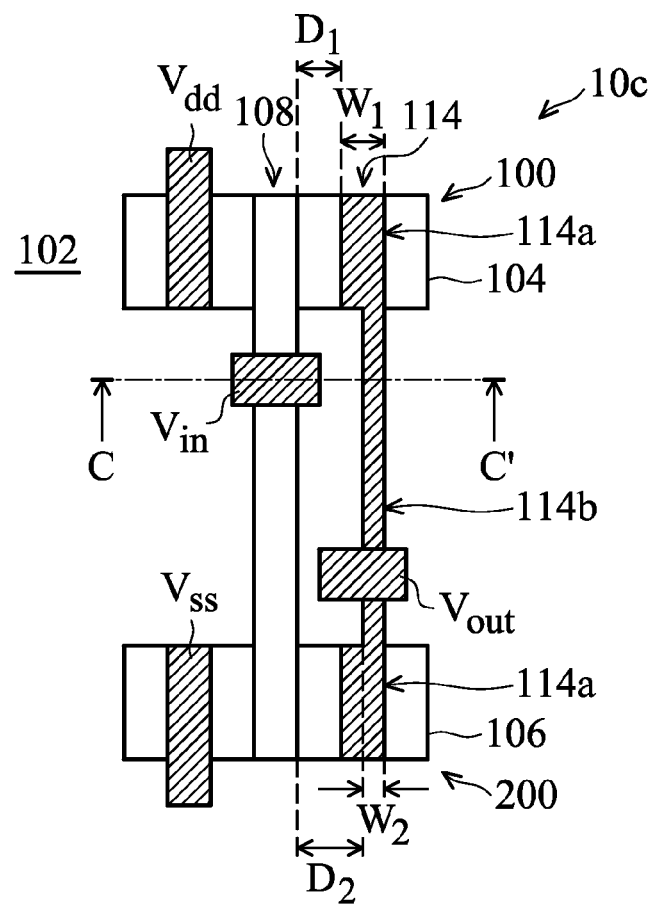
FIG. 3A illustrates a layout of an IC structure which can also be represented by the circuit diagram shown in FIG. 1A in accordance with some embodiments.
Figure 3B:
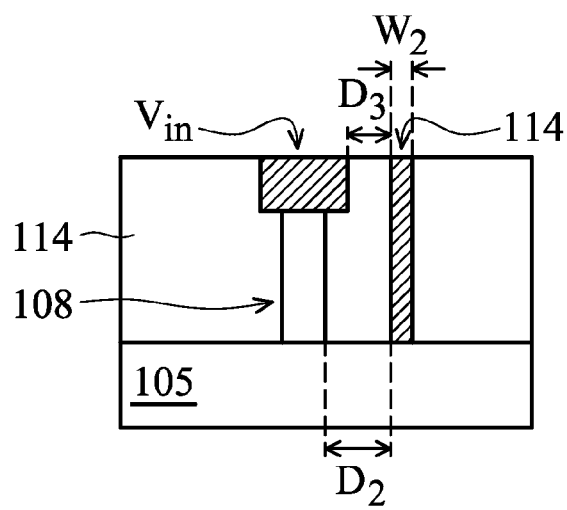
FIG. 3B illustrates a cross-sectional representation of the IC structure shown along line C-C' in FIG. 3A in accordance with some embodiments

FIG. 3A illustrates a layout of an IC structure 10c which can also be represented by the circuit diagram shown in FIG. 1A in accordance with some embodiments. FIG. 3B illustrates a cross-sectional representation of IC structure 10c along line C-C' in FIG. 3A in accordance with some embodiments.

As shown in FIG. 3A, first semiconductor device 100 and second semiconductor device 200 are interconnected by a thinned contact 114 in accordance with some embodiments. Thinned contact 114 is formed over substrate 102 and extends from first diffusion region 104 to second diffusion region 106 across isolation structure 105. In addition, thinned contact 114 has wide portions 114a over first diffusion region 104 and second diffusion region 106 and a thin portion 114b over isolation structure 105.

As shown in FIGS. 3A and 3B, wide portion 114a of thinned contact 114 has a width $W_1$, and thin portion 114b of thinned contact 114 has a width $W_2$ smaller than width $W_1$. In some embodiments, width $W_1$ is in a range from about 10 nm to about 100 nm. In some embodiments, width $W_2$ is in a range from about 5 nm to about 90 nm. In some embodiments, the difference between width $W_1$ and width $W_2$ is in a range from about 5 nm to about 50 nm. In some embodiments, the ratio of width $W_1$ to width $W_2$ is in a range from about 1.1 to about 5. When the ratio of width $W_1$ to width $W_2$ is too small, risks of signal shortage may increase. When the ratio of width $W_1$ to width $W_2$ is too large, the resistance of thinned contact 114 may increase.

Since width $W_2$ of thin portion 114b of thinned contact 114 is smaller than width $W_1$ of wide portion 114a, the distance $D_1$ between gate structure 108 and thinned contact 114 (e.g. wide portion 114a) over first diffusion region 104 and second diffusion region 106 is less than the distance $D_2$ between gate structure 108 and thinned contact 114 (e.g. thin portion 114b) over isolation structure 105. In some embodiments, distance $D_1$ is in a range from about 5 nm to about 50 nm. In some embodiments, distance $D_2$ is in a range from about 10 nm to about 100 nm. In some embodiments, the ratio of distance $D_1$ to distance $D_2$ is in a range from about 0.1 to about 0.9.

In addition, since distance $D_2$ between gate structure 108 and thinned contact 114 (e.g. thin portion 114b) over isolation structure 105 is relatively large, signal shortage between the metal line formed over gate structure 108 (e.g. $V_{in}$ metal line) and thinned contact 114 over isolation structure 105 is prevented. In some embodiments, the distance $D_3$ between $V_{in}$ metal line and thinned contact 114 (e.g. thin portion 114b) is in a range from about 5 nm to about 30 nm. In some embodiments, the ratio of distance $D_1$ to distance $D_3$ is in a range from about 0.2 to about 10.

In some embodiments, thinned contact 114 is formed by a manufacturing process that includes using a cutting mask. FIGS. 4A to 4E illustrate cross-sectional representations of various stages of forming IC structure 10c using a cutting mask 124 in accordance with some embodiments.

Figure 4A:
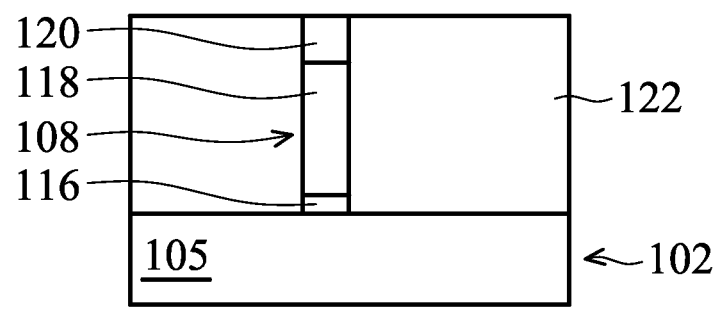
FIGS. 4A to 4E illustrate cross-sectional representations of various stages of forming an IC structure using a cutting mask in accordance with some embodiments.

As shown in FIG. 4A, substrate 102 is provided. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

Substrate 102 includes first diffusion region 104, second diffusion region 106 (not shown in FIG. 4A, referred to FIG. 3A), and isolation structure 105 formed between first diffusion region 104 and second diffusion region 106. In some embodiments, first diffusion region 104 and second diffusion region 106 are oxide diffusion regions formed in substrate 102. In some embodiments, first diffusion region 104 and second diffusion region 106 further includes source and drain regions. In some embodiments, isolation structure 105 includes a shallow trench isolation (STI) structure.

Gate structure 108 is formed over substrate 102 in accordance with some embodiments. As shown in FIG. 4A, gate structure 108 includes a gate dielectric layer 116, a gate electrode 118, and a hard mask 120 in accordance with some embodiments.

Gate dielectric layer 116 is formed on substrate 102 in accordance with some embodiments. In some embodiments, gate dielectric layer 116 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials.

Gate electrode 118 is formed on gate dielectric layer 116 in accordance with some embodiments. In some embodiments, gate electrode 118 is made of a conductive material, such as polysilicon, metal, metal alloy, and/or metal silicide. In some embodiments, gate electrode 118 is made of aluminum, tungsten, cobalt, tantalum, titanium aluminum, copper, or doped polysilicon.

Hard mask 120 is formed on gate electrode 118 in accordance with some embodiments. In some embodiments, hard mask 120 is made of dielectric materials such as silicon oxide, silicon nitride, silicon oxynitride, or silicon carbide.

Gate structure 108 may be formed by a procedure that includes deposition, photolithography patterning, and etching processes. The deposition processes may include chemical vapor deposition (CVD), physical vapor deposition (PVD), atomic layer deposition (ALD), high density plasma CVD (HDPCVD), metal organic CVD (MOCVD), or plasma enhanced CVD (PECVD). The photolithography patterning processes may include photoresist coating (e.g. spin-on coating), soft baking, mask aligning, exposure, post-exposure baking, developing the photoresist, rinsing, drying (e.g. hard baking), and/or other applicable processes. The etching processes may include dry etching, wet etching, and/or other etching methods (e.g. reactive ion etching).

After gate structure 108 is formed, an inter-layer dielectric (ILD) layer 122 is formed over substrate 102, as shown in FIG. 4A in accordance with some embodiments. In some embodiments, ILD layer 122 includes multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. ILD layer 122 may be formed by CVD, PVD, ALD, spin-on coating, and/or other applicable processes.

Figure 4B:
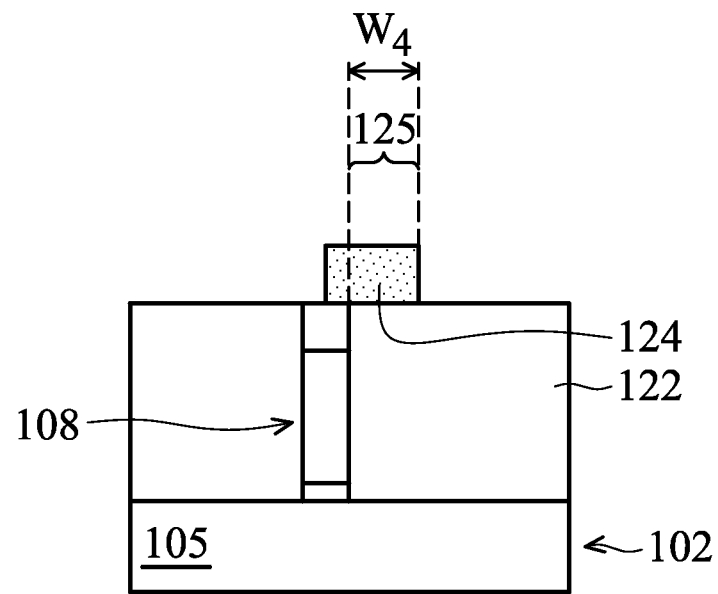
Figure 5A:
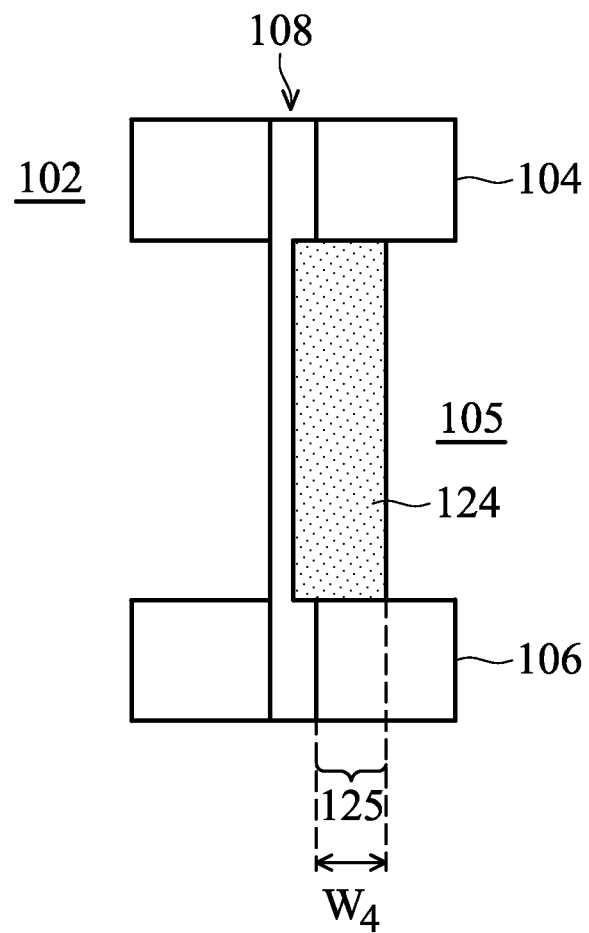
FIGS. 5A to 5C illustrate top views of the IC structure shown in FIGS. 4B, 4C, and 4E in accordance with some embodiments.

Next, cutting mask 124 is formed over substrate 102 to cover a portion of gate structure 108 over isolation structure 105, as shown in FIG. 4B in accordance with some embodiments. FIG. 5A illustrates a top view of IC structure 10c shown in FIG. 4B in accordance with some embodiments. As shown in FIGS. 4B and 5A, gate structure 108 extends from first diffusion region 104 to second diffusion region 106 across isolation structure 105. Cutting mask 124 is formed over a portion of gate structure 108 over isolation structure 105. In addition, cutting mask 124 extends over gate structure 108 to form an extending portion 125. Extending portion 125 extends over a portion of ILD layer 122 adjacent to gate structure 108 over isolation structure 105. However, cutting mask 124 does not extend over first diffusion region 104 or second diffusion region 106 in accordance with some embodiments. In some embodiments, extending portion 125 of cutting mask 124 has a width $W_4$ extending from gate structure 108. In some embodiments, width $W_4$ is in a range from about 10 nm to about 100 nm.

It should be noted that although cutting mask 124 illustrated in FIG. 4B is formed over a portion of gate structure 108, in some other embodiments, cutting mask 124 is formed to cover the whole top surface of gate structure 108 over isolation structure 105.

In some embodiments, cutting mask 124 is made of silicon oxide, silicon nitride, silicon oxynitride, or silicon carbide. Cutting mask 124 may be formed by CVD, PVD, ALD, high density plasma CVD (HDPCVD), metal organic CVD (MOCVD), or plasma enhanced CVD (PECVD).

Figure 4C:
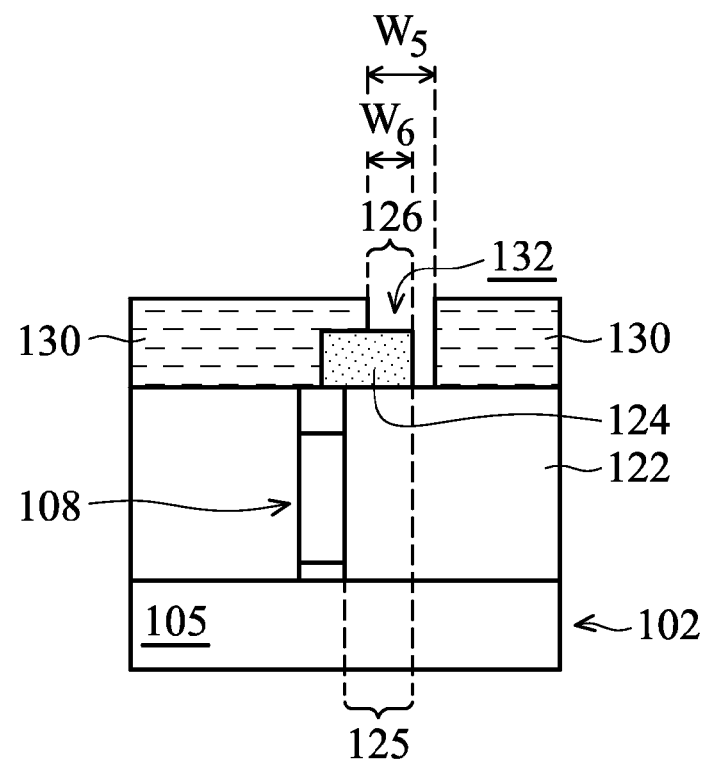
Figure 5B:
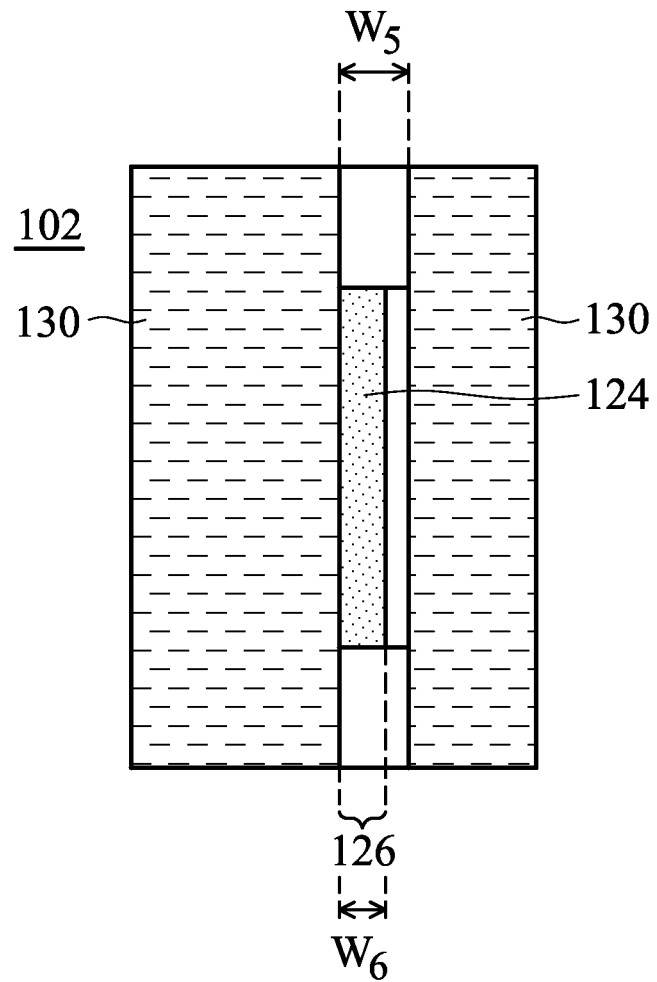

After cutting mask 124 is formed, a photoresist layer 130 is formed over substrate 102 to cover a portion of cutting mask 124, as shown in FIG. 4C in accordance with some embodiments. FIG. 5B illustrates a top view of IC structure 10c shown in FIG. 4C in accordance with some embodiments. As shown in FIGS. 4C and 5B, photoresist layer 130 includes an opening 132, and opening 132 exposes an exposed portion 126 of extending portion 125 of cutting mask 124.

In some embodiments, opening 132 has a width $W_5$, and exposed portion 126 of cutting mask 124 has a width $W_6$ smaller than $W_5$. In some embodiments, width $W_5$ is in a range from about 10 nm to about 100 nm. In some embodiments, width $W_6$ is in a range from about 5 nm to about 50 nm. In some embodiments, the ratio of width $W_5$ to width $W_6$ is in a range from about 1.1 to about 10.

Photoresist layer 130 may be a positive or negative photoresist layer. In some embodiments, photoresist layer 130 is formed by spin-on coating. Additionally, a bake process may be applied to photoresist layer 130 in accordance with some embodiments. In some embodiments, the bake process is a soft baking process.

After photoresist layer 130 is formed, an etching process is performed to remove a portion of ILD layer 122 which is exposed by opening 132 but is not covered by exposed portion 126 of cutting mask 124. More specifically, except for the portion that is covered by exposed portion 126, other portions of ILD layer 122 located under opening 132 are removed by the etching process. In some embodiments, the etching process is a wet etching process or a reactive ion etching (RIE) process.

Figure 4D:
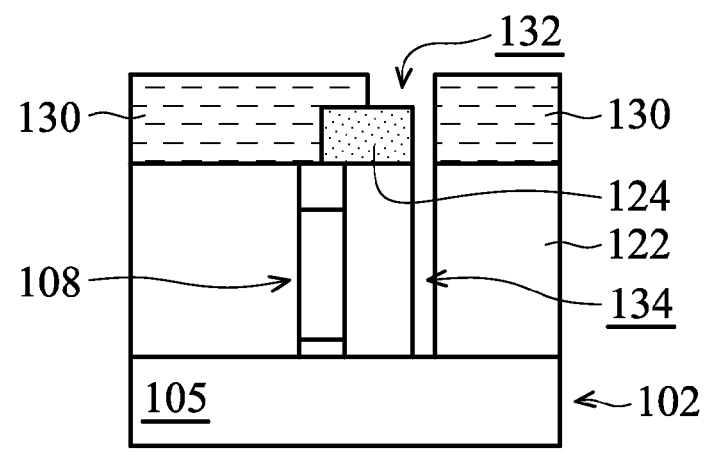

After the etching process, a trench 134 is formed, as shown in FIG. 4D in accordance with some embodiments. Trench 134 has wide portions over first diffusion region 104 and second diffusion region 106 and a thin portion over isolation structure 105. In some embodiments, the width of the wide portion of trench 134 is substantially equal to width $W_5$ of opening 132. In addition, the width of the thin portion of trench 134 is substantially equal to the difference between width $W_6$ and width $W_5$.

Figure 4E:
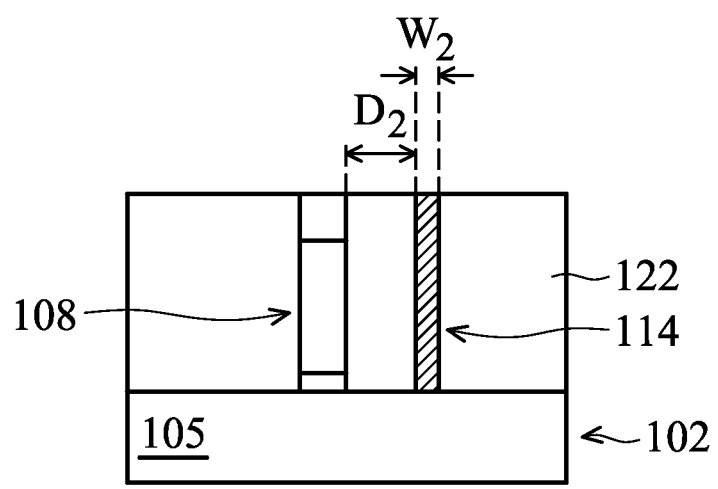

After trench 134 is formed, a conductive material is used to fill in trench 134 to form thinned contact 114, and photoresist layer 130 and cutting mask 124 are removed, as shown in FIG. 4E in accordance with some embodiments. In some embodiments, the conductive material is aluminum, copper, tungsten, titanium, tantalum, titanium nitride, tantalum nitride, nickel silicide, cobalt silicide, TaC, TaSiN, TaCN, TiAl, TiAlN, or other applicable conductive materials. Thinned contact 114 may be formed by sputtering, electroless plating, CVD, PVD, or ALD. In some embodiments, photoresist layer 130 and cutting mask 124 are removed by wet etching processes or a chemical mechanical polishing (CMP) process. The wet etching process may include using phosphoric acid, ammonium hydroxide, or hydrogen peroxide. In some embodiments, Vin metal line is further formed over gate structure 108 (not shown in FIG. 4E, referred to FIG. 3B).

Figure 5C:
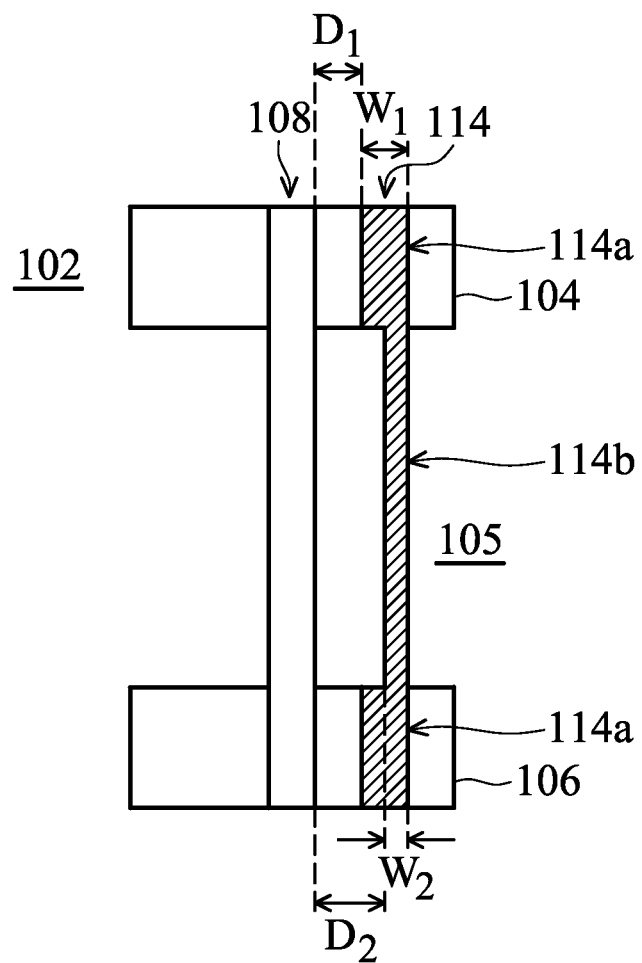

FIG. 5C illustrates a top view of IC structure 10c shown in FIG. 4E in accordance with some embodiments. Thinned contact 114 has wide portions 114a over first diffusion region 104 and second diffusion region 106 and thin portion 114b over isolation structure 105. As shown in FIGS. 4E and 5D, thinned contact 114 has wide portion 114a and thin portion 114b. Width $W_1$ of wide portion 114a is greater than width $W_2$ of thin portion 114b. Distance $D_1$ between gate structure 108 and thinned contact 114 over first diffusion region 104 (or second diffusion region 106) is less than distance D2 between gate structure 108 and thinned contact 114 over isolation structure 105.

In addition, since thinned contact 114 is formed by etching through opening 132 and depositing the conductive material in trench 134 formed by the etching process, width $W_1$ of wide portion 114a of thinned contact 114 is substantially equal to width $W_5$ of opening 132 in accordance with some embodiments. Furthermore, the difference between width $W_5$ and width $W_6$ is substantially equal to width $W_2$ of thin portion 114b of thinned contact 114.

As described previously, first semiconductor device 100 and second semiconductor device 200 are interconnected through various structures in accordance with some embodiments. When contact 112 is used to interconnect first semiconductor device 100 and second semiconductor device 200 (as shown in FIG. 1B), the distance between the metal line (e.g. $V_{in}$ metal line) formed over gate structure 108 may be too close to contact 112. Therefore, risks of signal shortage of IC structure 10a may be relatively high.

When additional gate structure 109 is used to interconnect first semiconductor device 100 and second semiconductor device 200 (as shown in FIG. 2A), the distance between gate structure 108 and additional gate structure 109 is far enough that signal shortage may be prevented. However, formation of addition metal gate 109 results in extra and useless layout area.

Therefore, in some embodiments, thinned contact 114 is used to interconnect first semiconductor device 100 and second semiconductor device 200. Since thinned contact 114 has thin portion 114b over isolation structure 105, distance $D_3$ between $V_{in}$ metal line and thinned contact 114 increases (e.g. compared to the distance between $V_{in}$ metal line and contact 112). Therefore, signal shortage between $V_{in}$ metal line and thinned contact 114 is prevented.

In addition, the routing of IC structure 10c decreases (e.g. compared to IC structure 10b shown in FIG. 2A). That is, IC structure 10c requires less layout area than IC structure 10b to realize the circuit diagram illustrated in FIG. 1A. Therefore, circuit device density is improved.

Furthermore, IC structure 10c is formed by using cutting mask 124 in accordance with some embodiments. Cutting mask 124 enables formation of thin portion 114b of thinned contact 114. It should be noted that thin portion 114b of thinned contact 114 may be too thin to be formed by a single mask having a thin portion over isolation structure 105, or width $W_2$ of thin portion 114b of thinned contact 114 cannot be controlled accurately. However, width $W_2$ of thin portion 114b of thinned contact 114 can be formed as design by using cutting mask 124. In addition, formation of cutting mask 124 is easy and low-cost without complicated manufacturing processes.

Embodiments of mechanisms for an integrated circuit structure are provided. The integrated circuit structure includes a thinned contact to interconnect a first semiconductor device and a second semiconductor device over a substrate. The thinned contact includes a thin portion over an isolation structure. A metal line is formed over a gate structure over the substrate, and the thin portion of the thinned contact prevents the metal line from being too close to the thinned contact. In addition, the thinned contact enables decreasing the layout area of the integrated circuit structure. Therefore, circuit device density is improved.

In some embodiments, an integrated circuit (IC) structure is provided. The IC structure includes a substrate including a first diffusion region, a second diffusion region, and an isolation structure separating the first diffusion region and the second diffusion region. The IC structure further includes a gate structure formed over the substrate, and the gate structure extends from the first diffusion region to the second diffusion region. The IC structure further includes a contact formed over the substrate, and the contact comprises a wide portion over the first diffusion region and the second diffusion region and a thin portion over the isolation structure.

In some embodiments, an integrated circuit (IC) structure is provided. The integrated circuit (IC) structure includes a substrate including a first diffusion region and a second diffusion region, and the first diffusion region and the second diffusion region are separated by an isolation structure. The IC structure further includes a gate structure formed over the substrate, and the gate structure extends from the first diffusion region to the second diffusion region across the isolation structure. The IC structure further includes a contact formed over the substrate, and the contact comprises a wide portion over the first diffusion region and the second diffusion region and a thin portion over the isolation structure. The IC structure further includes a metal line formed over the gate structure over the isolation structure.

In some embodiments, a method for forming an integrated circuit (IC) structure is provided. The method includes providing a substrate comprising a first diffusion region, a second diffusion region, and an isolation structure separating the first diffusion region and the second diffusion region. The method further includes forming a gate structure over the substrate and forming an inter-layer dielectric (ILD) layer adjacent to the gate structure over the substrate. The method further includes forming a cutting mask over a portion of the gate structure over the isolation structure, and the cutting mask has an extending portion covering a portion of the ILD layer over the isolation structure. The method further includes forming a photoresist layer having an opening, and a portion of the extending portion of the cutting mask is exposed by the opening. The method further includes etching the ILD layer through the opening to form a trench and filling the trench with a conductive material to form a contact.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit (IC) structure, comprising:
   a substrate comprising a first diffusion region, a second diffusion region, and an isolation structure separating the first diffusion region and the second diffusion region;
   a gate structure formed over the substrate, wherein the gate structure extends from the first diffusion region to the second diffusion region; and
   a contact formed over the substrate, wherein the contact comprises a wide portion over the first diffusion region and the second diffusion region and a thin portion over the isolation structure, the wide portion and the thin portion join at a junction between the first diffusion region and the isolation structure, and a width of the wide portion at a junction between the first diffusion region and the isolation structure is larger than a width of the thin portion at the junction between the first diffusion region and the isolation structure.

2. The IC structure as claimed in claim 1, wherein the wide portion of the contact has a first width and the thin portion of the contact has a second width, and a ratio of the first width to the second width is in a range from about 1.1 to about 5.

3. The IC structure as claimed in claim 1, wherein the wide portion of the contact has a first width and the thin portion of the contact has a second width, and a difference between the first width and the second width is in a range from about 5 nm to about 50 nm.

4. The IC structure as claimed in claim 1, wherein the thin portion of the contact has a second width in a range from about 5 nm to about 90 nm.

5. The IC structure as claimed in claim 1, wherein a distance between the contact and the gate structure over the isolation structure is greater than a distance between the contact and the gate structure over the first diffusion region and the second diffusion region.

6. The IC structure as claimed in claim 1, further comprising:
   a metal line formed over the gate structure over the isolation structure.

7. The IC structure as claimed in claim 6, wherein a width of the metal line is larger than a width of the gate structure.

8. The IC structure as claimed in claim 6, wherein a ratio of a distance between the contact and gate structure over the first diffusion region to a distance between the contact and the metal line is in a range from about 0.1 to about 0.9.

9. An integrated circuit (IC) structure, comprising:
   a substrate comprising a first diffusion region and a second diffusion region, wherein the first diffusion region and the second diffusion region are separated by an isolation structure;
   a gate structure formed over the substrate, wherein the gate structure extends from the first diffusion region to the second diffusion region across the isolation structure;
   a contact formed over the substrate, wherein the contact comprises a wide portion over the first diffusion region and the second diffusion region and a thin portion over the isolation structure, the wide portion and the thin portion join at a junction between the first diffusion region and the isolation structure, and a width of the wide portion at a junction between the first diffusion region and the isolation structure is larger than a width of the thin portion at the junction between the first diffusion region and the isolation structure; and
   a metal line formed over the gate structure over the isolation structure.

10. The IC structure as claimed in claim 9, wherein the wide portion of the contact has a first width and the thin portion of the contact has a second width, and a ratio of the first width to the second width is in a range from about 1.1 to about 5.

11. The IC structure as claimed in claim 9, wherein the wide portion of the contact has a first width and the thin portion of the contact has a second width, and a difference between the first width and the second width is in a range from about 5 nm to about 50 nm.

12. The IC structure as claimed in claim 9, wherein a distance between the contact and the gate structure over the isolation structure is greater than a distance between the contact and the gate structure over the first diffusion region and the second diffusion region.

13. The IC structure as claimed in claim 9, wherein a width of the metal line is larger than a width of the gate structure.

14. The IC structure as claimed in claim 9, wherein a ratio of a distance between the contact and gate structure over the first diffusion region to a distance between the contact and the metal line is in a range from about 1.1 to about 10.

15. An integrated circuit (IC) structure, comprising:
   a substrate comprising a first diffusion region, a second diffusion region, and an isolation structure separating the first diffusion region and the second diffusion region;
   a gate structure formed over the substrate; and
   a contact formed over the substrate, wherein the contact comprises a wide portion and a thin portion, and a distance between the gate structure and the wide portion of the contact is less than a distance between the gate structure and the thin portion of the contact, the wide portion and the thin portion join at a junction between the first diffusion region and the isolation structure, and a width of the wide portion at a junction between the first diffusion region and the isolation structure is larger than a width of the thin portion at the junction between the first diffusion region and the isolation structure.

16. The IC structure as claimed in claim 15, wherein the wide portion is formed over the first diffusion region of the substrate, and the thin portion is formed over the isolation region of the substrate.

17. The IC structure as claimed in claim 15, wherein a ratio of a width of the wide portion of the contact to a width of the thin portion of the contact is in a range from about 1.1 to about 5.

18. The IC structure as claimed in claim 15, wherein a width of the thin portion of the contact is in a range from about 5 nm to about 90 nm.

19. The IC structure as claimed in claim 15, further comprising:
   a metal line formed over the gate structure, wherein a width of the metal line is larger than a width of the gate structure.

20. The IC structure as claimed in claim 19, wherein a ratio of a distance between the contact and gate structure over the first diffusion region to a distance between the contact and the metal line is in a range from about 0.1 to about 0.9.

* * * * *